United States Patent
Critchley et al.

(10) Patent No.: US 10,295,561 B2
(45) Date of Patent: May 21, 2019

(54) ROBUST FAULT DIAGNOSIS FOR ELECTRONIC DEVICES

(71) Applicant: International Business Machines Corporation, Armonk, NY (US)

(72) Inventors: Daniel S. Critchley, Winchester (GB); Timothy F. McCarthy, Eastleigh (GB); Roderick G. C. Moore, Bournemouth (GB); Jonathan W. Short, Eastleigh (GB)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 59 days.

(21) Appl. No.: 14/062,068

(22) Filed: Oct. 24, 2013

(65) Prior Publication Data
US 2014/0131436 A1  May 15, 2014

(30) Foreign Application Priority Data
Nov. 14, 2012  (GB) ..................... 1220443

(51) Int. Cl.
*G01R 1/02* (2006.01)
*G01R 31/25* (2006.01)

(52) U.S. Cl.
CPC ............. *G01R 1/02* (2013.01); *G01R 31/25* (2013.01)

(58) Field of Classification Search
CPC ... B41M 5/395; B41M 5/41; G02F 1/133516; G02F 1/13394; G06F 11/327; G06F 21/445; G06F 21/606; G06K 7/1095; G06Q 10/087; G06Q 20/027; G06Q 20/20; G06Q 20/367; G06Q 20/3674; G06Q 20/401

USPC ........................................................ 235/375
See application file for complete search history.

(56) References Cited

U.S. PATENT DOCUMENTS

| | | | |
|---|---|---|---|
| 4,535,456 A * | 8/1985 | Bauer et al. ................ 714/31 |
| 6,212,651 B1 * | 4/2001 | Schieve et al. ............. 714/36 |
| 6,221,543 B1 * | 4/2001 | Guehler et al. ............. 430/7 |
| 7,493,525 B2 | 2/2009 | Wigley et al. | |
| 9,007,465 B1 * | 4/2015 | Fontanez ............... H04N 7/147 348/159 |
| 2008/0218437 A1 * | 9/2008 | Shimoi ....................... 345/30 |
| 2009/0157354 A1 * | 6/2009 | Ady et al. .................. 702/183 |
| 2010/0313161 A1 | 12/2010 | LeChevalier et al. | |

(Continued)

FOREIGN PATENT DOCUMENTS

| EP | 1617397 | 1/2006 |
|---|---|---|
| EP | JP2009026226 | 2/2009 |

(Continued)

OTHER PUBLICATIONS

GB Application No. GB1220443.4, Search Report and Examination Opinion dated Mar. 22, 2013, 3 pages.

(Continued)

*Primary Examiner* — Thien M Le
*Assistant Examiner* — Tae W Kim
(74) *Attorney, Agent, or Firm* — Cantor Colburn LLP; Robert Sullivan

(57) ABSTRACT

One aspect includes an electronic device that includes a component configured to generate diagnostic information indicative of a fault occurring in the electronic device. The electronic device also includes a persistent display coupled to the component and configured to display the diagnostic information.

12 Claims, 2 Drawing Sheets

(56) References Cited

U.S. PATENT DOCUMENTS

| | | | |
|---|---|---|---|
| 2012/0110353 A1 | 5/2012 | Ehrlich et al. | |
| 2013/0032634 A1* | 2/2013 | McKirdy | 235/375 |
| 2014/0033257 A1* | 1/2014 | Hjelmstedt | 725/51 |
| 2014/0292344 A1* | 10/2014 | Le Neel | G01R 31/3679 |
| | | | 324/426 |

FOREIGN PATENT DOCUMENTS

| | | | |
|---|---|---|---|
| EP | 2267599 | | 12/2010 |
| JP | 2008158789 | | 7/2008 |
| KR | 2004096484 | * | 11/2004 |
| WO | WO2009076259 | | 6/2009 |

OTHER PUBLICATIONS

Cisco ASR 901 Series Aggregation Services Router Software Configuration Guide, Onboard Failure Logging, Chapter 24, OL-23826-03, May 2012, 4 pages.

J. Davidson, et al., Storing Failure Information into Non-Volatile Memory, an IP.com Prior Art Database Technical Disclosure, IP.com No. IPCOM000114175D dated Nov. 1, 1994, 3 pages.

* cited by examiner

ROBUST FAULT DIAGNOSIS FOR ELECTRONIC DEVICES

PRIORITY

The present application claims priority to Great Britain Application No. 1220443.4 filed on Nov. 14, 2012, and all the benefits accruing therefrom under 35 U.S.C. § 119, the contents of which are incorporated by reference in its entirety herein.

FIELD OF THE INVENTION

The present invention relates to an electronic device comprising a fault diagnosis module configured to diagnose a fault of a component of the electronic device and to generate diagnostic information indicative of the diagnosed fault. The present invention further relates to a method of facilitating fault diagnosis for such an electronic device and to a computer program product that facilitates the execution of at least some aspects of such a method.

BACKGROUND

Nowadays, everyday life is dominated by the presence of electronic devices in many different forms. For instance, in a domestic setting, such devices play an integral part in home heating (boilers), food storage (refrigerators and freezers) and preparation (microwave ovens, hobs), home entertainment (high fidelity equipment, television, radio, and so on), and many more examples will be apparent. Similarly, in a professional or business environment, electronic devices play a pivotal rule, e.g., computers, servers, cash registers, manufacturing equipment, medical equipment, and so on.

It is therefore of the utmost importance that such electronic devices are reliable, as a device failure can be inconvenient or even dangerous to an end user, and can reduce consumer confidence in the electronic device. Obviously, it is practically impossible to rule out device failure. Nevertheless, in case of a device failure, it is important that the fault causing the failure is correctly diagnosed, e.g., to allow repair of the device or improvement of subsequent designs of the device to reduce the risk of the same fault reoccurring.

For this reason, many electronic devices encounter fault display error codes that allow an end user to establish the cause of the fault, e.g., by consultation of a user manual. Such error codes can also be communicated to a service point to allow off-site diagnosis of the fault, such that repairs of the electronic device can be carried out more efficiently and sometimes even remotely.

A problem is that such error codes are typically lost when the electronic device encounters a loss of power, which is not unusual when developing a fault. In such a scenario, the end user is at a loss as to the cause of the fault, which seriously hampers efficient resolution of the fault.

A similar problem is addressed in U.S. Pat. No. 7,493,525 B2, which discloses a method, system and apparatus for managing data pertaining to the failure of a network device. The data is stored in a non-volatile memory, which retains its data in the event of a power failure, such that the fault can be diagnosed even in the event of a power loss to the network device. However, such fault diagnosis requires a relatively complex retrieval of the diagnostic data from the non-volatile memory, which typically will have to be performed by trained staff. It therefore does not facilitate the end user to establish the cause of the fault, as the end user generally is unable to perform such complex retrieval, not in the least because the end user does not have access to the tools required for such a retrieval process.

SUMMARY

One embodiment is an electronic device that includes a component configured to generate diagnostic information indicative of a fault occurring in the electronic device. The electronic device also includes a persistent display coupled to the component and configured to display the diagnostic information.

Another embodiment is a method of facilitating fault diagnosis for an electronic device. The method includes providing an electronic device that has a component configured to generate diagnostic information indicative of a fault occurring in the electronic device, and a persistent display coupled to the component and configured to display the diagnostic information. The diagnostic information is generated and sent from the component to the persistent display, where the diagnostic information is displayed on the persistent display.

According to a further embodiment, a computer program product is provided. The computer program product includes a computer-readable storage medium having computer-readable program code, when executed on a computer having at least one processor, causes the at least one processor to receive a bar code captured from a persistent display of an electronic device. The bar code includes diagnostic information indicative of a fault. The captured bar code is interpreted, and guidance is output on addressing the fault based on the interpretation.

BRIEF DESCRIPTION OF THE SEVERAL VIEWS OF THE DRAWINGS

Exemplary embodiments of the present invention will now be described, by way of example only, with reference to the following drawings, in which.

DETAILED DESCRIPTION

Figure 1:
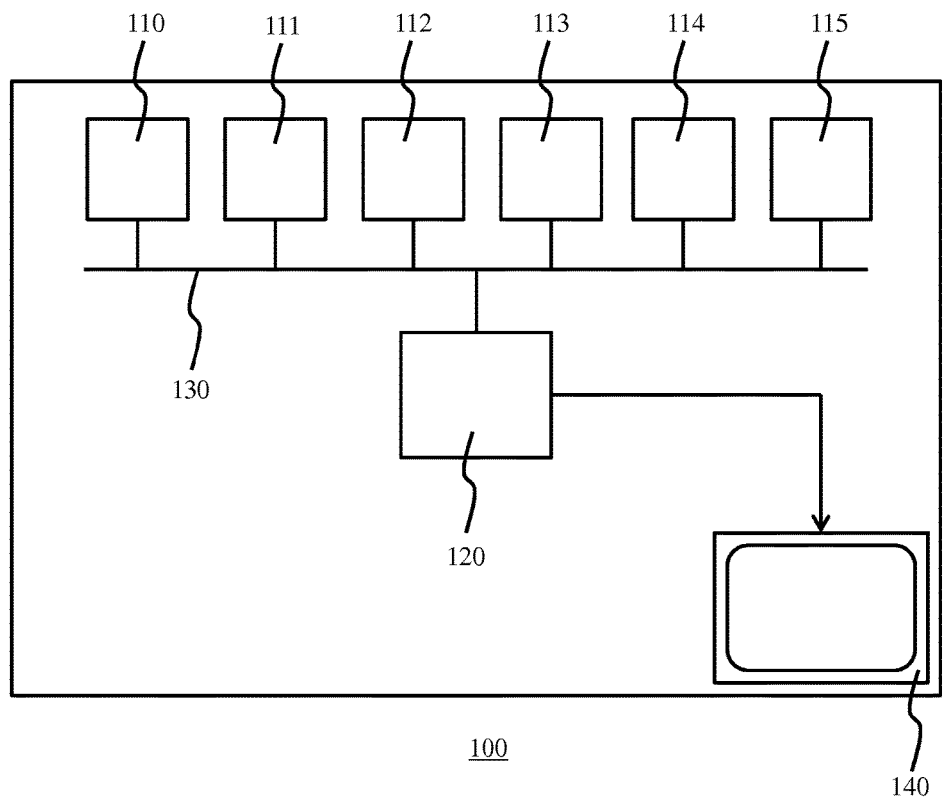
FIG. 1 schematically depicts an electronic device according to an exemplary embodiment.

An exemplary embodiment provides an electronic device capable of generating diagnostic information in a manner such that the information is readily available upon a power failure of the electronic device. An exemplary embodiment further provides a method of facilitating fault diagnosis for an electronic device in which the diagnostic information is readily available upon a power failure of the electronic device.

According to an aspect, there is provided an electronic device comprising a component configured to generate diagnostic information indicative of a fault occurring in the electronic device; and a persistent display coupled to the fault diagnosis module, wherein the persistent display is configured to display the diagnostic information. An exemplary embodiment is based on the insight that a persistent display, i.e., a display which is brought into a stable state in which it retains its displayed information until the stable state is altered by the application of a force such as an electromagnetic force, can be used to display the diagnostic information. This ensures that when the electronic device loses power, the persistent display retains its stable state (as the electronic device no longer can apply an electromagnetic force to the display to alter its state), such that the displayed diagnostic information is retained on the display. This at least in some situations enables recovery of the electronic device, e.g., by independent end user intervention or support center-assisted end user intervention, which can obviate a need for expensive return material authorization (RMA) procedures.

Any suitable type of persistent display may be used. In a particularly suitable embodiment, the persistent display is an electrophoretic display, which is sometimes also referred to as an electronic ink display or an e-ink display, as electrophoretic displays can be provided at relatively low cost and are reflective displays, i.e., do not require a backlight to display the image but rely on the reflection of incident light instead. Alternatively, the persistent display may for instance be a cholesteric liquid crystal display, as cholesteric liquid crystals can be switched between bi-stable states, which also allows an image to be retained on such a display in the absence of a supply of power to the display. In an embodiment, the persistent display has a screen area of 10 cm$^2$ or less to further reduce cost, as only a small display, e.g., the size of a postage stamp, is required to display the diagnostic information.

The component may take any suitable form. In an embodiment, the component is configured to perform self-diagnosis. Alternatively, the component may be configured to diagnose the fault in another component of the electronic device. In yet a further embodiment, the electronic device further comprises a microprocessor comprising the component.

The diagnostic information may take any suitable form. In an embodiment, the diagnostic information comprises an error code, which has the advantage that the end user can readily interpret the diagnostic information, e.g., by consultation of a user manual or by contacting a help desk.

In an alternative embodiment, the diagnostic information comprises a bar code such as a quick response bar code, which has the advantage that detailed diagnostic information can be displayed on the persistent display, which for instance can be used for debug purposes or for root cause analysis of the fault by a maintenance engineer or a designer of the electronic device.

According to another aspect of the invention, there is provided a method of facilitating fault diagnosis for an electronic device, the method providing an electronic device according to an exemplary embodiment, generating the diagnostic information with the component; sending the diagnostic information from the component to the persistent display; and displaying the diagnostic information on the persistent display. This ensures that the diagnostic information is readily available even in the case of a power failure of the electronic device, as previously explained.

In an embodiment, the diagnostic information comprises a bar code such as a quick response bar code, the method further comprising capturing the bar code from the persistent display, e.g., by scanning the bar code or taking a photograph of the bar code, such that the diagnostic information may be forwarded to a remote location for offsite analysis. As mentioned before, the use of a (quick response) bar code has the further advantage that detailed diagnostic information indicative of the component failure can be provided.

In an embodiment, the method further comprises converting the captured bar code into a legible version of the diagnostic information such that the diagnostic information encapsulated in the bar code can be readily interpreted by a person.

In accordance with yet another aspect of an exemplary embodiment, there is provided a computer program product comprising a computer-readable storage medium having computer-readable program code, when executed on a computer comprising at least one processor, causes the at least one processor to receive the captured (e.g., scanned or photographed) bar code, interpret the captured bar code, and output guidance on addressing the fault based on the interpretation.

For instance, the computer program product may, when executed on the at least one processor, cause the at least one processor to convert the captured bar code into a legible version of the diagnostic information and output the legible version of the diagnostic information. This has the advantage that the end user may use a personal computer to interpret the bar code, which may obviate the need to contact a remote helpdesk or service center to diagnose the fault. The computer program product advantageously may include a personal computer further comprising a scanner or a camera, e.g., a tablet or laptop device including a camera, such that the capture of the bar code and its subsequent conversion into a legible version of the diagnostic information can be achieved with minimal user intervention.

The computer-readable storage medium may be any medium that can be accessed by a computer for the retrieval of digital data from said medium. Non-limiting examples of a computer-readable storage medium include a CD, DVD, flash memory card, a USB memory stick, a random access memory, a read-only memory, a computer hard disk, a storage area network, a network server, an Internet server and so on.

Turning now to the Figures, it should be understood that the Figures are merely schematic and are not drawn to scale. It should also be understood that the same reference numerals are used throughout the Figures to indicate the same or similar parts.

FIG. 1 schematically depicts an electronic device 100 according to an embodiment of the present invention. The electronic device 100 comprises a plurality of components 110-115 that may be communicatively coupled to a data and/or signal processing element 120, e.g., a microprocessor or microcontroller, via one or more electrically conductive connections 130, e.g., a data communication bus or any other suitable implementation of such conductive connections, e.g., point-to-point (P2P) connections. Six components are shown by way of non-limiting example only; it should be understood that the electronic device 100 may have any suitable number of components.

The electronic device 100 further comprises a persistent display 140 coupled to the processing element 120. The persistent display 140 is a display device capable of retaining a displayed image in the absence of a power supply. Such image retention typically can be achieved using materials that exhibit stable states in the absence of an applied electromagnetic field, e.g., electrophoretic materials or cholesteric liquid crystals. Non-limiting examples of such a persistent display 140 include electronic ink (e-ink) displays and a cholesteric LC display such as the Reflex™ display marketed by Kent Displays.

The processing element 120 may be configured to act as a fault diagnosis component configured to generate diagnostic information indicative of a fault occurring in another component of the electronic device, e.g., one of components 110-115, with the persistent display 140 being arranged to display the diagnostic information. Although the processing element 120 is shown as a separate component, it should be understood that this is by way of non-limiting example only. It is for instance equally feasible that at least some of the components 110-115 comprise an integrated processing element 120, such that the components can perform self-diagnosis, or that the processing element 120 is integrated in the persistent display 140.

Some example embodiments of the generation of such diagnostic information will be presented below by way of non-limiting example only. It should be understood that the generation of diagnostic information is well-known per se, and that any suitable manner in which the diagnostic generation can be generated may be applied to the teachings of exemplary embodiments.

In one embodiment, the fault diagnosis component, e.g., processing element 120, may simply provide the persistent display 140 with state information produced by the one or more components 110-115 regardless of whether a fault has occurred, e.g., data produced by at least one of the components 110-115 or the last instruction executed by at least one of the components 110-115, such that upon the occurrence of a terminal fault leading to a shutdown of the electronic device 100 the state information of the one or more components 110-115 can be used as debug information. This embodiment is particularly useful in case the diagnostic information is to be interpreted by a developers or a service engineer of the electronic device 100, as it provides a potentially valuable insight into the state of the electronic device immediately prior to the occurrence of the terminal fault, which may facilitate the determination of the cause of the fault without requiring extensive and expensive investigation of the electronic device 100.

Figure 2:
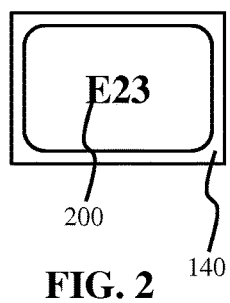
FIG. 2 schematically depicts a persistent display device displaying diagnostic information in accordance with an exemplary embodiment.

In another embodiment, the fault diagnosis component, e.g., processing element 120, may generate fault diagnosis information in response to the detection of a fault in one or more of the components 110-115 and instruct the persistent display 140 to display the generated fault diagnosis information. Such diagnostic information may be produced in any suitable way. For instance, a component may include a sensor, with the fault diagnosis module monitoring the sensor output to determine whether or not the sensor output falls within normal operating limits. Upon the fault diagnosis module detecting an abnormal sensor reading, the fault diagnosis module may produce an error code 200 and instruct the persistent display 140 to display this error code 200 as shown in FIG. 2. Such an error code may be generated in any suitable manner, e.g., by providing data storage such as a look-up table or a memory (not shown) in which the error codes are stored against abnormal sensor readings, and retrieving the appropriate error code from the data storage.

One advantage of generating an error code 200 is that an end user of the electronic device 100 can quickly identify the error, e.g., by looking up the error in a user manual or by contacting a technical help desk, where a support staff member may be able to assist the end user in identifying and rectifying the error without the need for expensive RMA procedures.

It will be apparent to the skilled person that the fault diagnosis module may monitor the behavior of the one or more components 110-115 in any suitable manner, and that the use of sensors for such monitoring is just one of many straightforward alternatives. It is for instance equally feasible to monitor the data output of a component and generate an error code in response to the data assuming an abnormal value, amongst many other examples that will be apparent to the skilled person.

Figure 3:
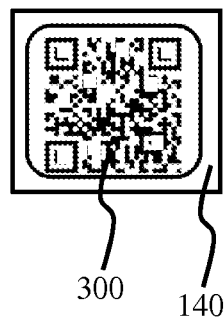
FIG. 3 schematically depicts a persistent display device displaying diagnostic information in accordance with an exemplary embodiment.

In another example embodiment, the fault diagnosis component, e.g., processing element 120, may generate fault diagnosis information in response to the detection of a fault in one or more of the components 110-115 in the form of a bar code, e.g., a quick response bar code 300, and instruct the persistent display 140 to display the generated bar code as shown in FIG. 3. This has the advantage that more fine-grained diagnostic information can be displayed on the persistent display 140. This information may not be readily interpretable by the end user of the electronic device 100, but it does enable the end user to capture the bar code 300, e.g., by scanning or photographing it.

The end user may for instance have access to a computer program product that comprises a computer-readable storage medium having computer-readable program code, and that when executed on a computer comprising at least one processor, causes the at least one processor to receive the captured bar code, interpret the captured bar code and provide the end user with guidance to address the fault of the electronic device based on the interpretation of the captured bar code. For instance, the computer program product may be configured to convert the captured bar code into text-based version of the diagnostic information and output the text-based version of the diagnostic information.

The computer program product may be a computer further including a capture device such as a scanner or camera for capturing the bar code 300, such that the user may use the computer to capture the bar code 300 from the persistent display 140 and process the captured bar code 300 on the same computer, which therefore requires minimal user intervention. The computer may for instance be a smart phone, a tablet computer, a laptop computer or any other portable device capable of such image processing.

Alternatively, the end user may forward the captured bar code 300 to a remote support center for expert assistance in diagnosing and potentially rectifying the fault of the electronic device 100.

In the above embodiments, the persistent display 140 preferably has a minimal size to ensure that the additional cost to the electronic device 100 can be minimized. For instance, the persistent display 140 may have a display area of 10 cm$^2$ or less, of 5 cm$^2$ or less or even as small as 1 cm$^2$ or less.

Figure 4:
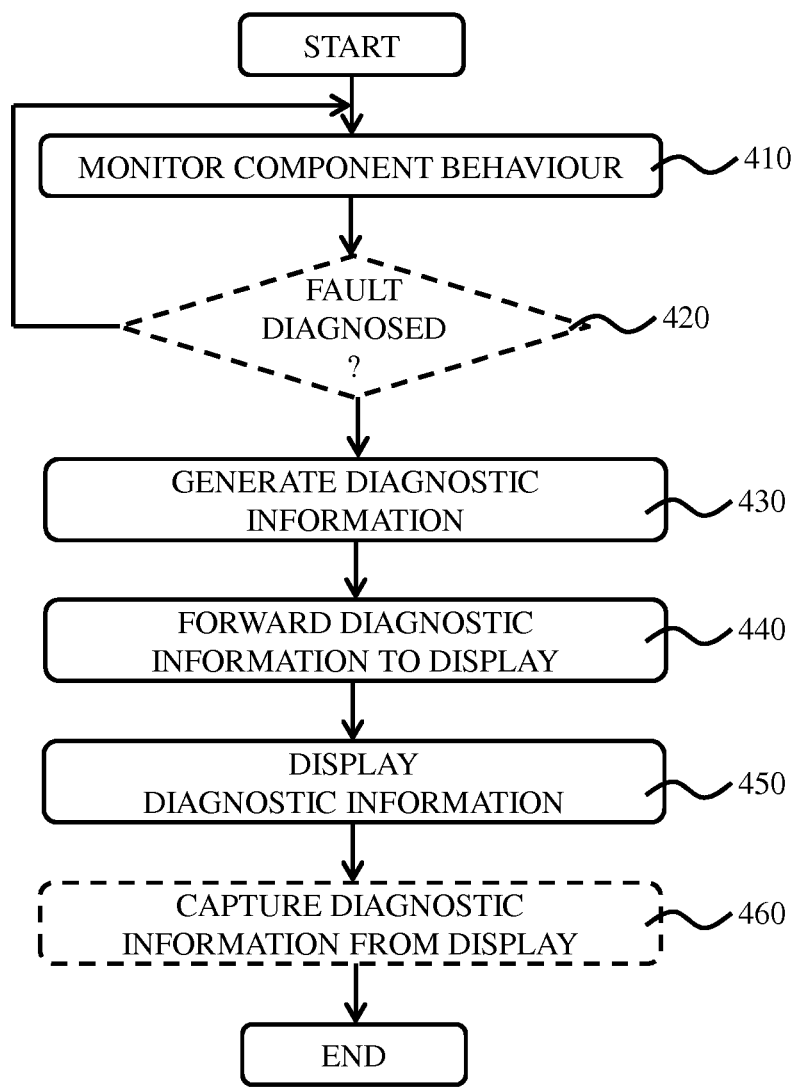
FIG. 4 depicts a flow chart of a method in accordance with an exemplary embodiment.

In an embodiment, the electronic device 100 is configured to execute the method as depicted in the flow chart of FIG. 4. Upon starting the method, the electronic device 100, or more specifically the diagnostic information generating component 120, monitors component behavior in step 410. Upon the detection of a fault in step 420, the diagnostic information generating component 120 generates the diagnostic information in step 430, for instance by identifying the fault that occurred in the monitored component of the electronic device 100 and generating the diagnostic information pertaining to the identified fault, e.g., an error code 200 or a bar code such as a quick response bar code 300. Alternatively, the diagnostic information generating component 120 may simply forward the output data or other state information from the component monitored in step 410, in which case step 420 may be omitted.

The generated diagnostic information is forwarded by the diagnostic information generating component 120 to the persistent display 140 in step 440, which displays the diagnostic information in step 450. In case of the generated diagnostic information comprising a bar code such as a quick response bar code 300, the method may further comprise the optional step 460 of capturing, e.g., scanning or photographing, the displayed diagnostic information before terminating the method.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While particular embodiments of the present invention have been described herein for purposes of illustration, many modifications and changes will become apparent to those skilled in the art. Accordingly, the appended claims are intended to encompass all such modifications and changes as fall within the scope of this invention.

What is claimed is:

1. An electronic device comprising:
a component comprising a first processing element that executes a fault diagnosis module configured to generate diagnostic information indicative of a fault occurring in the electronic device, wherein the component is configured to perform a self-diagnosis and diagnose the fault in another component comprising a second processing element within the electronic device, and further wherein the fault diagnosis module interfaces with a sensor, and the fault diagnosis module produces an alpha-numeric error code as the diagnostic information based on detecting an abnormal reading of the sensor and provides the diagnostic information as a bar code based on state information indicative of the last instruction executed by the second processing element prior to occurrence of a terminal fault that shuts down the electronic device; and
a persistent display coupled to the component and configured to display the diagnostic information, wherein the abnormal reading of the sensor is detected based on a determination that an output of the sensor is outside normal operating limits;
wherein the bar code is converted to a text-based version of the diagnostic information;
wherein the diagnostic information is output on the persistent display; and
wherein an end user of the electronic device addresses the fault associated with the electronic device using the diagnostic information.

2. The electronic device of claim 1, wherein the persistent display is an electrophoretic display.

3. The electronic device of claim 1, wherein the persistent display is a cholesteric liquid crystal display.

4. The electronic device of claim 1, wherein the persistent display has a screen area of 10 cm$^2$ or less.

5. The electronic device of claim 1, wherein the diagnostic information comprises a quick response bar code that identifies the fault.

6. A method of facilitating fault diagnosis for an electronic device, the method comprising:
providing an electronic device comprising a component comprising a first processing element configured to generate diagnostic information indicative of a fault occurring in the electronic device, and a persistent display coupled to the component and configured to display the diagnostic information;
generating the diagnostic information by a fault diagnosis module executed by the first processing element of the component, wherein the component is configured to perform a self-diagnosis and diagnose the fault in another component comprising a second processing element within the electronic device, and further wherein the fault diagnosis module interfaces with a sensor;
producing, by the fault diagnosis module, an alpha-numeric error code as the diagnostic information based on detecting an abnormal reading of the sensor, wherein the abnormal reading of the sensor is detected based on a determination that an output of the sensor is outside normal operating limits;
providing the diagnostic information as a bar code based on state information indicative of the last instruction executed by the second processing element prior to occurrence of a terminal fault that shuts down the electronic device;
converting the bar code to a text-based version of the diagnostic information;
sending the diagnostic information from the component to the persistent display;
displaying the diagnostic information on the persistent display; and
addressing, by an end user of the electronic device, the fault associated with the electronic device using the diagnostic information.

7. The method of claim 6, wherein the diagnostic information comprises a bar code that is a quick response bar code which identifies the fault, and the method further comprises capturing the bar code from the persistent display.

8. The method of claim 7, wherein the capturing further comprises scanning the displayed bar code.

9. The method of claim 7, wherein the capturing further comprises taking a photograph of the displayed bar code.

10. The method of claim 7, further comprising converting the captured bar code into legible diagnostic information.

11. The method of claim 7, wherein the persistent display is an electrophoretic display or a cholesteric liquid crystal display.

12. The method of claim 7, wherein the persistent display has a screen area of 10 cm$^2$ or less.

* * * * *